US006650182B2

(12) United States Patent
Kim et al.

(10) Patent No.: US 6,650,182 B2
(45) Date of Patent: Nov. 18, 2003

(54) EXPONENTIAL TRANSCONDUCTANCE AMPLIFIER

(75) Inventors: Jong K. Kim, Colorado Springs, CO (US); Elangovan Nainar, Longmont, CO (US); Michael P. Straub, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/016,962

(22) Filed: Dec. 14, 2001

(65) Prior Publication Data

US 2003/0112069 A1 Jun. 19, 2003

(51) Int. Cl.[7] .............................................. H03F 3/45
(52) U.S. Cl. ........................................ 330/252; 330/256
(58) Field of Search ............................... 330/252, 254, 330/256; 327/346, 359

(56) References Cited

U.S. PATENT DOCUMENTS

| 5,008,632 A | * | 4/1991 | Sutterlin | ...................... 330/256 |
| 5,940,235 A | | 8/1999 | Sasaki et al. | .................. 360/67 |
| 6,181,203 B1 | | 1/2001 | Newlin | ....................... 330/257 |

OTHER PUBLICATIONS

1. P.E. Allen et al., "CMOS Analog Circuit Design," 7.4 Comparator with Hysteresis, copyright by Saunders College Publishing, a division of Holt, Rinehart and Winston, Inc., pp. 349–357, 1987.

* cited by examiner

Primary Examiner—Steven J. Mottola
(74) Attorney, Agent, or Firm—Ryan, Mason & Lewis, LLP (57) ABSTRACT

A non-linear transconductance amplifier includes a differential input stage and a non-linear transconductance stage operatively coupled to the differential input stage. The differential input stage includes first and second inputs forming a non-inverting input and an inverting input, respectively, of the amplifier for receiving an input differential signal. The non-linear transconductance stage generates an output of the amplifier having a linear transconductance that is substantially zero when the input differential signal is within a predetermined range and a non-linear large transconductance when the input differential signal is outside the predetermined range. The amplifier provides improved response time to widely varying load conditions while possessing a low loop bandwidth. A threshold region where the output of the amplifier is substantially zero can be operatively adjusted and tightly controlled. Furthermore, the amplifier accomplishes these advantages without employing timing circuitry and without the necessary overhead and/or noise often associated with such timing circuitry.

24 Claims, 4 Drawing Sheets

EXPONENTIAL TRANSCONDUCTANCE AMPLIFIER

FIELD OF THE INVENTION

The present invention relates generally to amplifiers, and more particularly relates to a nonlinear transconductance amplifier for improving a response time of the amplifier to widely varying load conditions.

BACKGROUND OF THE INVENTION

In certain applications employing an amplifier, the load conditions experienced by the amplifier can often change significantly and abruptly. Conventional amplifiers experiencing widely varying load conditions typically utilize a large compensation capacitor coupled to the output of the amplifier in order to stabilize the amplifier over a wide range of output loads that may be encountered. Due to the size of the compensation capacitor that is required, however, the response time of the amplifier is significantly reduced. One such application in which load conditions can change rapidly is in a hard disk drive preamplifier system, which generally requires a low loop bandwidth for undistorted data recovery and fast settling time to meet write-to-read mode transition specifications.

Present hard disk drive system specifications require fast mode changes, for example, from a write mode to a read mode on the order of about 200 nanoseconds (ns) or less. In the read mode, the bias loop time constant should be greater than 100 microseconds ($\mu s$). In the write mode, large write signals may couple through read and write heads and through interconnects between the heads and the disk drive preamplifier. The coupled write mode signal amplitude can be much higher than the read mode signal. Thus, the parasitic coupling between write and read signal paths drives the read path direct current (dc) bias points far from their normal quiescent operating points during the write mode. Consequently, when the preamplifier transitions from write to read mode, the read bias loop sees a large error signal.

Figure 1:
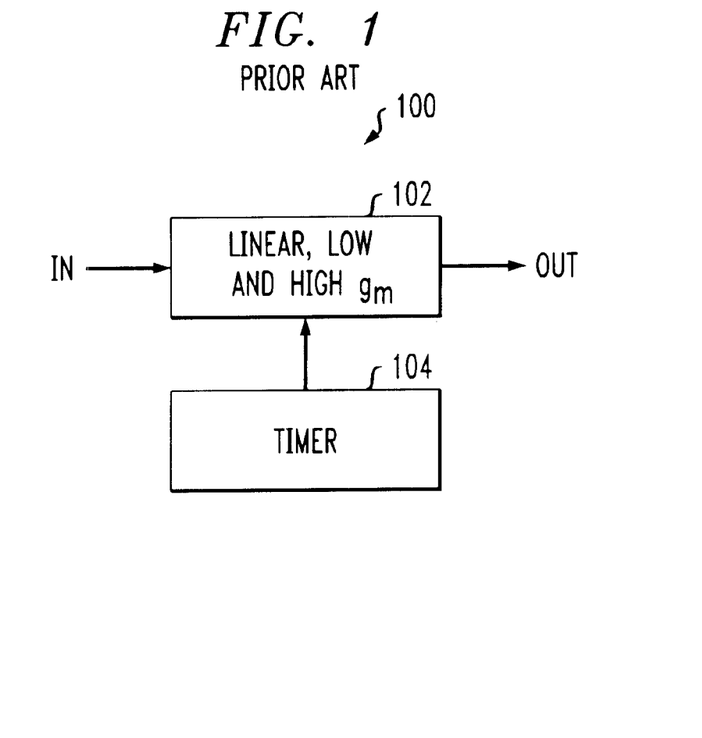
FIG. 1 is a block diagram illustrating a conventional amplifier arrangement employing a timer circuit.

To simultaneously meet fast write-to-read mode transition requirements while providing low loop bandwidth during the read mode, a timing circuit 104 has been used in conjunction with an operational amplifier 102, as is shown in FIG. 1. In this manner, the transconductance of the amplifier 102 in the bias loop is increased by switching a large current to the amplifier for a predetermined period when changing from write mode to read mode. In U.S. Pat. No. 5,940,235 to Sasaki et al., a reproducing circuit for a magnetic head uses exponential current amplification without employing timing circuitry. Some of the drawbacks to this circuit arrangement, however, include difficulty in controlling the slope of the output current and a threshold range of the amplifier, as well as providing a very narrow threshold range. The threshold range is the region in which the output current is essentially zero (or very small) for an input differential voltage that is close to zero. Outside this threshold range, the transconductance (i.e., output-current-to-input-voltage ratio) relation is an exponential function. If the threshold range is narrow, the read mode bias loop will be undesirably affected by a normal read signal and the amplifier will possess a loop bandwidth that is too large.

U.S. Pat. No. 6,181,203 to Newlin discloses a nonlinear transconductance amplifier which has an output transfer characteristic that exhibits two different nonlinear relationships depending on the input differential signal level applied to the amplifier. The amplifier requires a dual differential pair of input bipolar devices and a corresponding bipolar current mirror for each of the four input devices. Consequently, the amplifier requires substantial area on a silicon wafer and dissipates a significant amount of quiescent current. A pair of emitter degeneration resistors in two of the four current mirrors, in conjunction with a pair of emitter degeneration resistors associated with the dual differential input devices, provide control over the knee point at which the two nonlinear relationships switch. However, due at least in part to the number of resistive elements affecting this knee point, accurately setting the knee point of the amplifier can be quite difficult to accomplish. Moreover, this circuit configuration may be susceptible to temperature and process variations.

Accordingly, there exists a need for an amplifier circuit having an improved response time to widely varying load conditions, without employing timing circuitry. Moreover, it would be desirable to provide an amplifier having reduced quiescent current dissipation and improved stability over temperature and process variations.

SUMMARY OF THE INVENTION

The present invention provides an improved amplifier which simultaneously meets fast write-to-read mode transition requirements while possessing a low loop bandwidth for undistorted data recovery. Furthermore, the amplifier of the present invention accomplishes these advantages without employing timing circuitry and the necessary overhead and/or noise often associated with such circuitry. The amplifier exhibits a transconductance that is substantially zero or linear when an input differential voltage presented to the amplifier is zero or small and a transconductance that is large or nonlinear for comparatively large input signals. A threshold region where the output of the amplifier is substantially zero can be easily set and tightly controlled by adjusting a single circuit element.

In accordance with one aspect of the invention, an exponential transconductance amplifier includes a linear differential input stage and a nonlinear transconductance stage operatively coupled to the differential input stage. The differential input stage includes first and second inputs forming a non-inverting input and an inverting input, respectively, of the amplifier for receiving an input differential signal. The nonlinear transconductance stage generates an output of the amplifier that exhibits a linear transconductance which is substantially zero or linear when the input differential signal is within a predetermined range and exhibits a large nonlinear transconductance when the input differential signal is outside the predetermined range. In accordance with another aspect of the invention, the nonlinear transconductance amplifier includes temperature compensation circuitry for providing a threshold region that is substantially constant over a predetermined temperature range of operation.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

Figure 2:
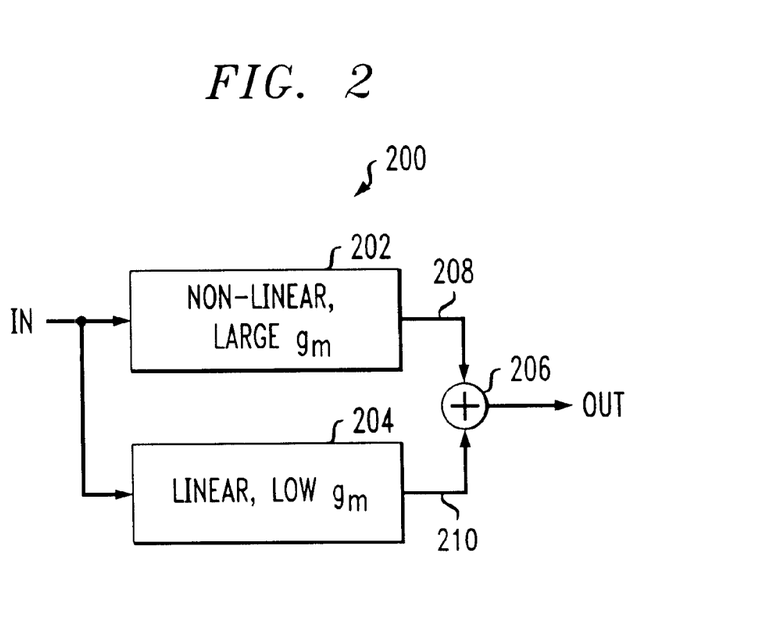
FIG. 2 is a block diagram illustrating a nonlinear transconductance amplifier, formed in accordance with one aspect of the present invention.

FIG. 2 depicts a block diagram of an amplifier 200, formed in accordance with one aspect of the present invention. The amplifier 200 includes an input IN coupled to a non-linear large transconductance ($g_m$) circuit 202 and a linear low transconductance circuit 204. Preferably, the input IN is a differential input, although a single-ended input is similarly contemplated by the present invention. An output 208 of the non-linear large transconductance circuit 202 is summed together with an output 210 of the linear low transconductance circuit 204 at a summing node 206 to form a combined output OUT of the amplifier 200. It is to be appreciated that the linear low transconductance circuit 204 may be implemented using a conventional amplifier or transconductance stage, as understood by those skilled in the art. Consequently, a detailed explanation of the linear low transconductance circuit 204 will not be presented herein.

Figure 5A:
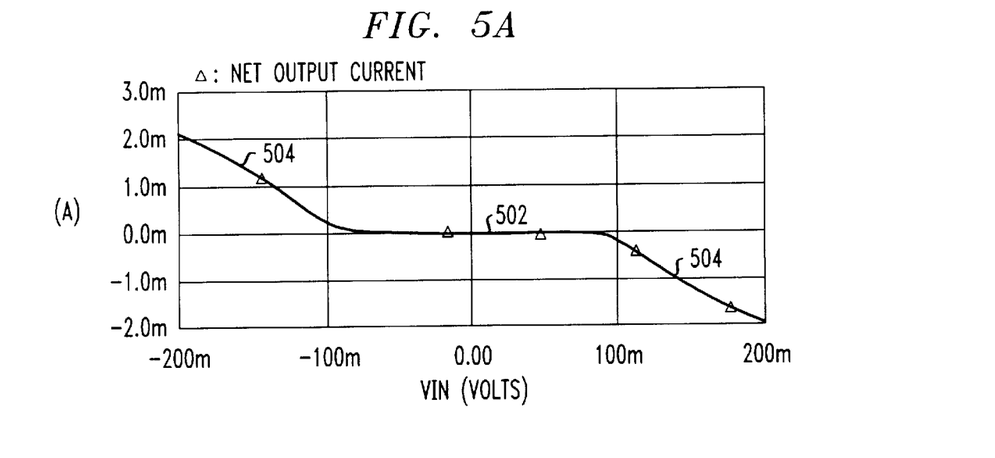
FIGS. 5A–5C are graphical representations illustrating output current verses input voltage for the amplifier depicted in FIG. 2.
Figure 5B:
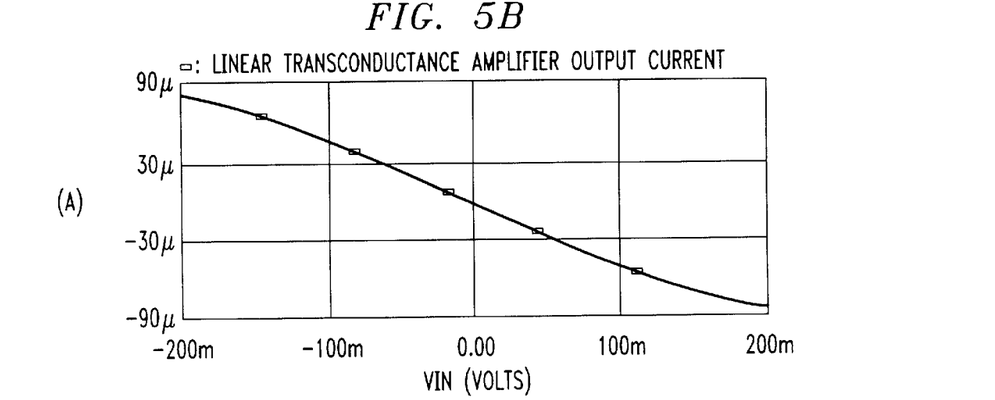
Figure 5C:
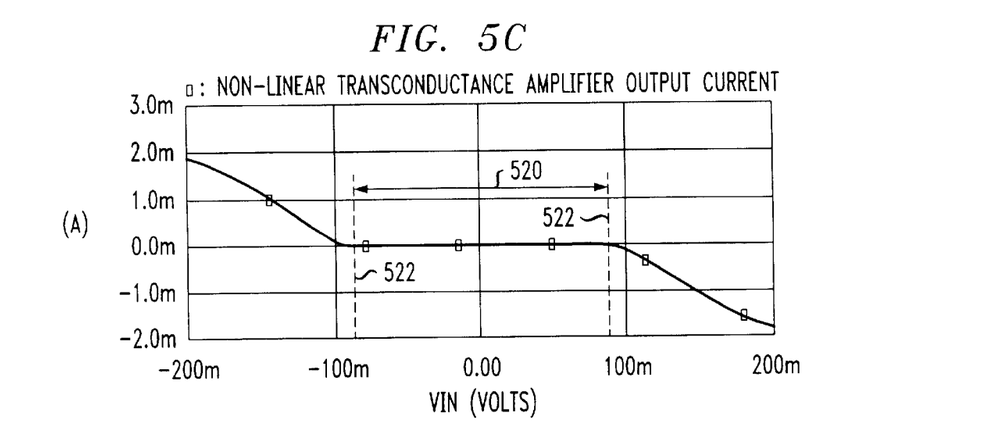

FIGS. 5A through 5C illustrate exemplary graphical representations of three outputs of the amplifier 200 of FIG. 2 with respect to an input differential voltage ($V_{IN}$) applied to the amplifier 200, in accordance with the present invention. FIG. 5A corresponds to the net output OUT of the amplifier 200, FIG. 5B corresponds to the output 210 of the linear low transconductance circuit 204, and FIG. 5C corresponds to the output 208 of the non-linear transconductance circuit 202.

When an input signal applied to the input IN of amplifier 200 is small (e.g., ±20 millivolts (mV)), the amplifier output OUT exhibits a linear low transconductance, primarily resulting from the output 210 of the linear low transconductance circuit 204. This is depicted by the linear portion 502 on the graphical representation of output current verses input voltage illustrated in FIG. 5A. Moreover, when the input signal applied to the amplifier 200 is large (e.g., ±200 mV), the amplifier output OUT exhibits a non-linear large transconductance. This is depicted by the non-linear portions 504 on the graphical representation of FIG. 5A. In accordance with the present invention, a threshold region wherein an output current from the output 208 of the non-linear large transconductance circuit 202 is substantially zero can be precisely adjusted and controlled over temperature and process variations. The operation of the non-linear large transconductance circuit 202 of amplifier 200 will be described in detail herein below in conjunction with an illustrative exponential transconductance amplifier.

Figure 3:
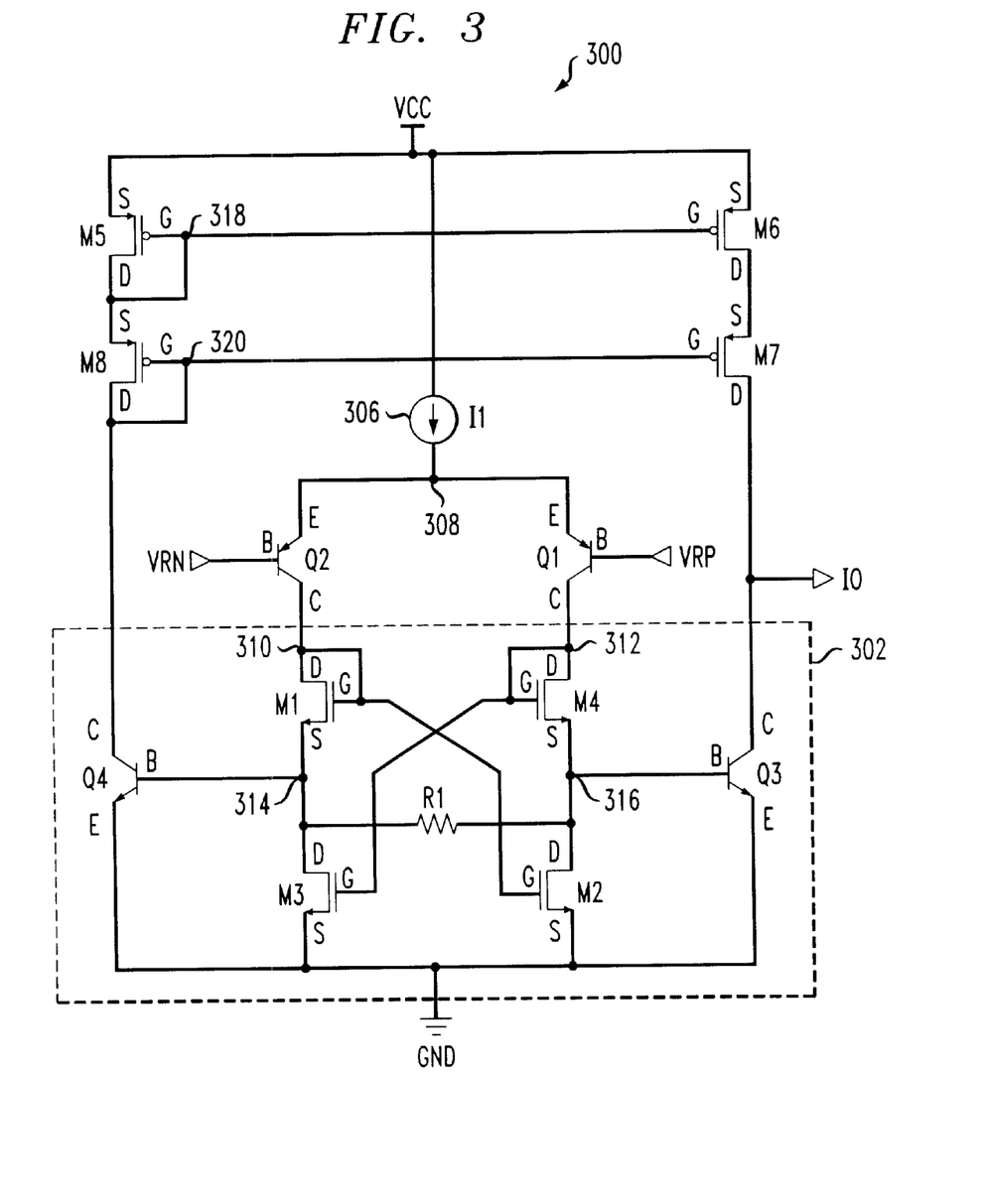
FIG. 3 is a schematic diagram illustrating an exemplary exponential transconductance amplifier, formed in accordance with the present invention.

With reference now to FIG. 3, an exemplary exponential transconductance amplifier 300 is shown, formed in accordance with the present invention. The illustrative exponential transconductance amplifier 300 includes a positive or non-inverting input VRP, a negative or inverting input VRN and an output IO, preferably in the form of a current. It is to be appreciated that a current output may be easily converted to a voltage output by including a current-to-voltage converter circuit, which may be a simple resistor (not shown), operatively coupled to the output of the amplifier, as understood by those skilled in the art. Thus, the illustrative exponential transconductance amplifier 300 may be considered a differential input amplifier. Although the amplifier 300 is shown using n-type metal-oxide-semiconductor (NMOS) and p-type metal-oxide-semiconductor (PMOS) transistor devices and npn and pnp bipolar junction transistor (BJT) devices, the present invention contemplates that one or more transistors may be replaced by other suitable alternative device types. Moreover, the transconductance amplifier 300 may be implemented using a complementary circuit architecture (e.g., n-type devices replaced by p-type devices, and vice versa) in a similar manner.

In accordance with the present invention, the exemplary exponential transconductance amplifier 300 includes a differential input stage and a non-linear transconductance stage operatively coupled to the differential input stage. The differential input stage comprises a pair of pnp input transistors Q1 and Q2, each of the transistors Q1, Q2 including an emitter terminal (E), a base terminal (B), and a collector terminal (C). As previously stated, although input transistors Q1, Q2 are depicted as bipolar devices, these transistors may be implemented using other suitable alternative devices, such as, for example, PMOS transistor devices, as understood by those skilled in the art. Transistors Q1 and Q2 are substantially matched (e.g., size, shape, etc.) at least in part to reduce the effect of offset. The emitter terminals of transistors Q1 and Q2 are coupled together at node 308, thus transistors Q1, Q2 may be considered to be in a common-emitter configuration. A bias circuit 306 is operatively coupled between the common-emitter junction at node 308 and a positive voltage supply, VCC, and provides a bias current for biasing the amplifier 300 to a stable direct current (DC) quiescent operating point. The bias circuit 306 is shown as a constant current source I1, although it is to be appreciated that the bias circuit may be implemented, for example, as a simple resistor or it may be an active device, such as a transistor coupled to an appropriate bias voltage source (not shown), as understood by those skilled in the art. The base terminals of transistors Q1 and Q2 form the differential inputs VRP and VRN, respectively, of the amplifier 300.

With continued reference to FIG. 3, the non-linear transconductance stage is preferably implemented as an exponential transconductance stage 302 coupled to the collector terminals of input transistors Q1, Q2 for operatively controlling an output current of the amplifier. The exponential transconductance stage 302 is configured such that at relatively small input signal levels (e.g., ±20 mV), the output current through the output IO of amplifier 300 will be substantially zero and at relatively large input signal levels (e.g., ±200 mV), the output current will increase exponentially in response to a linear input signal applied to the amplifier 300. In addition to providing control over the output current of the amplifier, exponential transconductance stage 302 provides a load for input transistors Q1 and Q2.

The predetermined differential input voltage range $V_{IN}$ (e.g., $|V_{IN}| \leq 90$ mV) wherein the output current through output IO of amplifier 300 is essentially zero is defined herein as the threshold region of the amplifier. In accordance with the present invention, the threshold region of amplifier 300 may be selectively adjusted and tightly controlled by the exponential transconductance stage 302, as will be explained in further detail herein below. This threshold region is represented as the horizontal portion 520 on the curve depicted in FIG. 5C. Threshold region knees or endpoints 522 on the curve of FIG. 5C refer to the points at which an absolute value of the output current through the output IO of amplifier 300 begins to increase exponentially for a given linear differential input voltage (e.g., $|V_{IN}|>90$ mV) applied to the amplifier.

The exponential transconductance stage 302 is comprised of NMOS transistors M1 through M4, each of the transistors M1 through M4 having a drain terminal (D), a gate terminal (G) and a source terminal (S). The exponential transconductance stage 302 further includes npn bipolar transistors Q3 and Q4, each having an emitter terminal (E), a base terminal (B), and a collector terminal (C). Transistors Q3 and Q4 provide the necessary exponential transconductance for circuit 302 by virtue of the inherent exponential relationship between the collector current ($I_C$) of a bipolar transistor to its base-emitter voltage ($V_{BE}$), which may be expressed as $$I_C = I_S \cdot \exp\frac{V_{BE}}{V_T}, \qquad [1]$$

where $I_S$ is a constant (saturation current) used to describe the transfer characteristic of the transistor in the forward-active region (typically on the order of $10^{-14}$ to $10^{-15}$ Amperes), $V_{BE}$ is the base-emitter voltage of the transistor and $V_T$ is the thermal voltage of the transistor (typically about 26 millivolts at 300 degrees Kelvin). It is to be appreciated that, in accordance with the present invention, transistors Q3 and Q4 may be replaced by suitable alternative devices or circuits for providing other non-linear transconductance characteristics in the non-linear large transconductance circuit 202 depicted in FIG. 2.

Preferably, transistors M1, M3 and Q4 associated with the inverting (VRN) input side of the amplifier 300 are closely matched to corresponding transistors M4, M2 and Q3, respectively, associated with the non-inverting (VRP) input side of the amplifier. Additionally, the sizes of transistors M1 through M4, generally expressed as a ratio (W/L) of the width (W) of the particular transistor device to its length (L), are appropriately selected so that bipolar transistors Q3 and Q4 are biased at a desired operating point. To further provide accurate temperature tracking, corresponding components in the amplifier 300 may be placed in close relative proximity to one another on a semiconductor die.

With continued reference to FIG. 3, transistors M1 and M4 are each preferably connected in a diode configuration (i.e., the gate terminal of the transistor being coupled to its drain terminal). Transistors M1 and M4 essentially function, at least in part, as voltage level shifters for biasing transistors Q3 and Q4 to a predetermined quiescent operating point. Consequently, it is to be appreciated that transistors M1 and M4 may, instead, be configured with their gate terminals coupled to an appropriate corresponding bias voltage source (not shown), as understood by those skilled in the art. The drain and gate terminals of transistor M4 are coupled to the collector terminal of transistor Q1 at node 312. Likewise, the drain and gate terminals of transistor M1 are coupled to the collector terminal of transistor Q2 at node 310. The source terminals of transistors M1 and M4 are coupled to the drain terminals of transistors M3 and M2 at nodes 314 and 316, respectively.

Transistors M2 and M3 may be considered load devices for the differential input stage comprised of transistors Q1 and Q2. Transistors M2 and M3 are arranged so that the gate terminals of each transistor are connected to nodes on opposite sides of amplifier 300 in a cross-coupled arrangement. Specifically, the gate terminal of transistor M2 is coupled to the gate terminal of transistor M1 at node 310 and the gate terminal of transistor M3 is coupled to the gate terminal of transistor M4 at node 312. The source terminals of transistors M2 and M3 are coupled to a negative voltage supply, which is preferably ground (GND) as shown.

The base terminals of transistors Q3 and Q4, which, as previously described, provide the exponential transconductance characteristic of the amplifier 300, are coupled to nodes 316 and 314, respectively. The emitter terminals of transistors Q3 and Q4 are connected to ground. A resistor R1 coupled between nodes 314 and 316 is preferably employed to linearize the base voltage seen by transistors Q3 and Q4. Without resistor R1 present, the voltage at the base terminals of transistors Q3, Q4 would increase sharply with slight changes in the differential input signal level applied to the amplifier 300, as will be discussed in more detail below. The value of resistor R1 may be selected to control a slope of the linear voltage seen at the base terminals of transistors Q3 and Q4, thus controlling the threshold region of the amplifier 300. As the value of resistor R1 is increased, the threshold region of the amplifier increases proportionally. Since the current that flows through resistor R1 is bidirectional, only a single circuit element is required to adjust the threshold region of the amplifier.

The collector terminal of transistor Q3 forms the output IO of the exponential transconductance amplifier 300. The amplifier 300 preferably includes a cascode current mirror functioning as a load operatively coupled to the collector terminals of transistors Q3 and Q4. The cascode current mirror comprises PMOS transistors M5 through M8. Transistors M5 and M8 are coupled togther in a stacked (cascode) arrangement, with the drain terminal of transistor M5 coupled to the source terminal of transistor M8. Likewise, transistors M6 and M7 are coupled togther in a stacked arrangement, with the drain terminal of transistor M6 coupled to the source terminal of transistor M7. Furthermore, transistors M5 and M8 are each connected in a diode configuration. The drain terminal of transistor M8 is coupled to the collector of transistor Q4 and the source terminal of transistor M5 coupled to the positive voltage supply, VCC. Likewise, the drain terminal of transistor M7 is coupled to the collector terminal of transistor Q3 and the source terminal of transistor M6 is coupled to VCC. The gate terminals of transistors M6 and M7 are coupled to the gate terminals of transistors M5 and M8 at nodes 318 and 320, respectively.

Assuming an emitter area scale factor of one (1) for each of the bipolar transistors Q3 and Q4, the sizes of the cascode mirror transistors M5 through M8 are chosen to be ideally equal. However, the present invention contemplates that transistors M6 and M7 may be scaled by any predetermined factor n in comparison to corresponding transistors M5 and M8, respectively, to produce a current through transistors M6, M7 that is n times greater than the current in transistors M5, M8, where n is a number greater than zero. In this instance, bipolar transistors Q3 and Q4 will be sized such that transistor Q3 has an emitter area that is n times greater than transistor Q4 to provide proper current balancing, as appreciated by those skilled in the art. By way of example only, if transistors M6 and M7 are sized such that their W/L ratios are twice that of transistors M5 and M8, respectively, transistor Q3 will be sized to have an emitter area which is twice that of transistor Q3.

As previously stated, the load for transistors Q3 and Q4 is preferably a cascode current mirror which replicates the collector current of transistor Q4 and operatively combines this current with the collector current of transistor Q3 at output node IO to generate the output current of the amplifier 300. The cascode load is preferred, at least in part, since this configuration desensitizes the effect of load impedance at the output IO of amplifier 300. As shown in FIG. 3, the amplifier output IO is a single-ended output. It is to be appreciated, however, that the amplifier 300 may be easily modified to provide a differential output, for example, by eliminating the diode connection of transistors M5 and M8 and instead connecting the gate terminals of these transistors to a corresponding bias voltage source (not shown). The collector terminal of transistor Q4 may then be used to form a complementary output of the amplifier 300.

Exemplary sizes for each of the transistors, as well as other components in the amplifier 300, are presented in Table 1 below for a conventional 0.8 micron ($\mu$m) bipolar-complementary metal-oxide-semiconductor (BiCMOS) fabrication process. For bipolar transistors Q1 through Q4, the area scale factor is preferably equal to one. It is to be appreciated, however, that the present invention is not to be limited to these specific sizes or to the type of fabrication process employed, but that other sizes and alternative circuit fabrication processes may be utilized in accordance with the techniques of the present invention as set forth herein.

TABLE 1

| Component Reference Name | Size/Value |
| --- | --- |
| M1 | 6.0 $\mu$m/0.8 $\mu$m |
| M2 | 6.0 $\mu$m/2.0 $\mu$m |
| M3 | 6.0 $\mu$m/2.0 $\mu$m |
| M4 | 6.0 $\mu$m/0.8 $\mu$m |
| M5 | 24.0 $\mu$m/0.8 $\mu$m |
| M6 | 24.0 $\mu$m/0.8 $\mu$m |
| M7 | 24.0 $\mu$m/0.8 $\mu$m |
| M8 | 24.0 $\mu$m/0.8 $\mu$m |
| R1 | 3.756K Ohms |

With continued reference to FIG. 3, the operation of the illustrative exponential transconductance amplifier 300 will now be described. When a differential input voltage applied across inputs VRP and VRN of the amplifier 300 is zero, the current flowing out of the collector terminal of transistors Q1 and Q2 will be ideally equal. In practice, certain factors, such as, for example, fabrication process variations and localized temperature gradients, may cause device mismatches in the amplifier which can result in a small offset between the collector currents of transistors Q1 and Q2.

Assuming symmetry in the differential input stage of amplifier 300, since the collector currents of transistors Q1 and Q2 will be substantially equal to each other and the base-emitter voltages of the two transistors will be equal, as previously stated, the voltages at the collector terminals of the transistors Q1, Q2 at nodes 310 and 312, and thus the gate voltages of transistors M3 and M2, respectively, will also be substantially equal to each other. At this operating point, the gate voltage of transistors M3 and M2 will be higher than the drain voltage of transistors M3 and M2 at nodes 314, 316, respectively, by an amount substantially equal to the gate-source voltage of transistors M1 and M4. Consequently, both transistors M3 and M2 will be operating in a linear region. As appreciated by those skilled in the art, a MOS transistor operating in the linear region exhibits a relatively low output impedance.

Transistors M1 through M4 are preferably sized such that a voltage present at nodes 314 and 316 will be low enough (e.g., less than about 0.5 volt) to prevent transistors Q4 and Q3, respectively, from turning on. As understood by those skilled in the art, knowing the drain current, $i_D$, flowing in a given MOS transistor, approximate sizes for each of the MOS transistors can be determined for a desired gate-source voltage ($V_{GS}$) for the transistor using, for example, the expression $$i_D = K'\left(\frac{W_{\mathit{eff}}}{2L_{\mathit{eff}}}\right)(V_{GS} - V_T)^2, \qquad [2]$$

where $W_{\mathit{eff}}$ and $L_{\mathit{eff}}$ are the effective width and length, respectively, of the transistor device, $K^1$ is the intrinsic transconductance parameter (in amperes/volt$^2$) based on the electron mobility and oxide thickness associated with the particular semiconductor fabrication process employed, and $V_T$ is the threshold voltage for the transistor. With transistors Q3 and Q4 off, amplifier 300 will be biased such that the collector current of transistors Q3 and Q4 will be substantially zero, and therefore the current flowing through the output IO of amplifier 300 will be substantially zero.

With the voltage at input terminal VRP of amplifier 300 held constant, as the voltage at input terminal VRN is increased (i.e., the emitter-base voltage of transistor Q1 is greater than that of transistor Q2), the collector current flowing through transistor Q1 increases while the collector current in transistor Q2 decreases. This will cause the gate voltage of transistor M3 to increase while the available drain current in transistor M3, which will be substantially the same as the collector current of transistor Q2, decreases, thereby moving the operating point of transistor M3 further into the linear region. The output impedance of transistor M3 thus decreases causing the base voltage of transistor Q4 to decrease toward zero, further preventing transistor Q4 from turning on. Concurrently, the gate voltage of transistor M2 will decrease, thus causing transistor M2 to turn off. As transistor M2 turns off, its output impedance will increase. With an increased collector current from transistor Q1 and the increased output impedance of transistor M2, the drain voltage of transistor M2 at node 316 will increase. This in turn will cause the base voltage of transistor Q3 to increase, thus turning on transistor Q3.

Without resistor R1 present, the base voltage of transistor Q3 will increase sharply, thereby causing transistor Q3 to sink a large output current. As previously stated, by adding resistor R1 connected between the base terminals of transistors Q4 and Q3 (i.e., across nodes 314 and 316), the voltage at the base terminal of transistor Q3 increases more linearly. In accordance with equation [1] above, a linear increase in base voltage, and therefore base-emitter voltage, of transistor Q3 results in an exponential increase in the collector current of transistor Q3.

It is to be appreciated that since the illustrative amplifier 300 is symmetrical with respect to the two inputs VRN and VRP, the amplifier will respond to a complementary differential input signal in a manner consistent to that previously described. Consequently, with the voltage at input terminal VRN of amplifier 300 held constant, as the voltage at input terminal VRP is increased, transistor Q3 will turn off and transistor Q4 will turn on, thus providing a source output current through output IO of amplifier 300. In either case, the slope of the linear increase in base voltage may be selectively controlled by adjusting the value of resistor R1 until a desired response characteristic is obtained.

Figure 4:
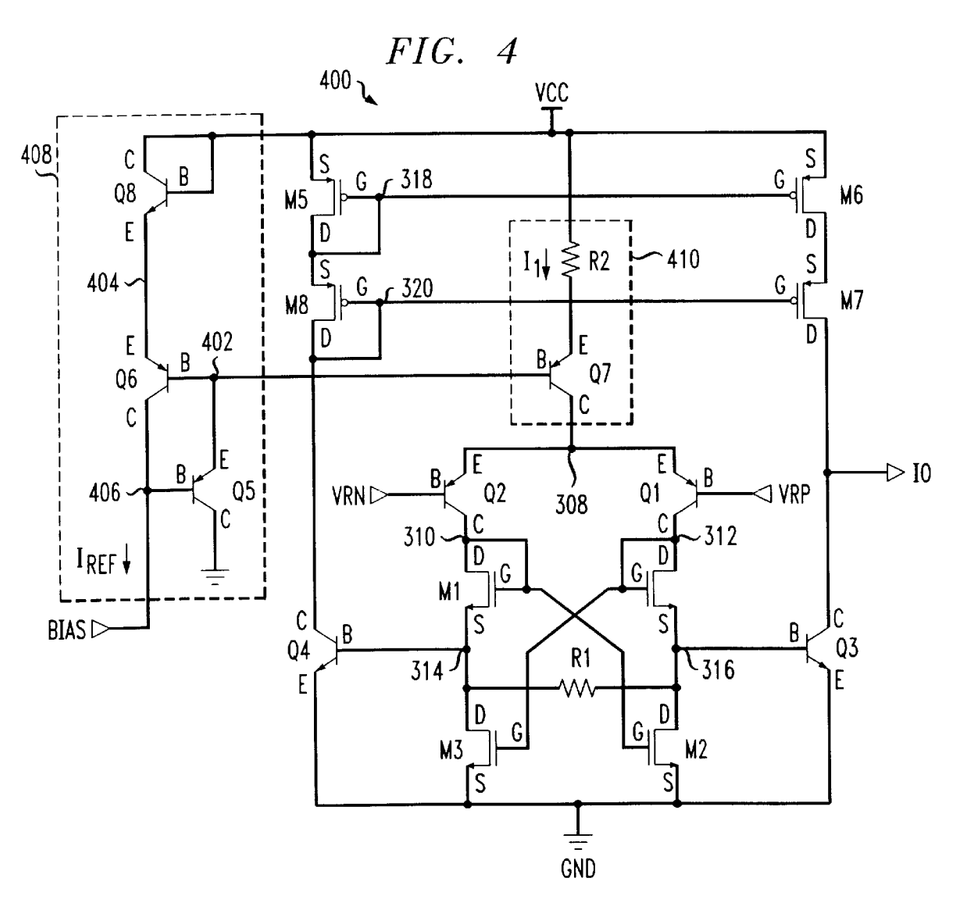
FIG. 4 is a schematic diagram illustrating the exponential transconductance circuit of FIG. 3 including a temperature compensation circuit, formed in accordance with the present invention.

FIG. 4 illustrates an exemplary exponential transconductance amplifier 400 formed in accordance with another aspect of the present invention. Amplifier 400 is essentially the same as the amplifier 300 previously described in connection with FIG. 3, with the exception that the constant current source I1 is replaced with temperature compensation circuitry for making the threshold region of amplifier 400 substantially constant over a given temperature range. As apparent from the figure, the temperature compensation circuitry preferably includes a bias current circuit 410 operatively coupled to a corresponding temperature-compensated bias voltage generator 408. The bias current circuit 410 is connected between the positive voltage supply VCC and the common emitter node 308. Bias voltage generator 408 includes a control input BIAS which may be used to selectively set the current in the amplifier 400. The BIAS input may be connected, for example, to a constant current sink or resistor to ground to provide a predetermined reference current $I_{REF}$ (e.g., 200 microamperes ($\mu$a)).

The bias current circuit 410 of the illustrative amplifier 400 includes a pnp transistor Q7 having a collector terminal (C) coupled to the common emitter node 308, an emitter terminal (E) coupled to the positive voltage supply VCC through a series connected resistor R2, and a base terminal (B) coupled to the bias voltage generator 408 at node 402. In conjunction with the corresponding bias voltage generator 408, bias current circuit 410 produces a current $I_1$ in the differential input stage which is proportional to $V_{BE}/R2$. It is to be appreciated that for optimum temperature tracking, resistor R2 is preferably fabricated of the same material and similar geometry as resistor R1 used to linearize the base-emitter voltage of transistors Q3 and Q4, as previously described.

With continued reference to FIG. 4, the temperature-compensated bias voltage generator 408 preferably includes an npn transistor Q8 and a pair of pnp transistors Q5 and Q6, each of the transistors having a collector terminal (C), a base terminal (B) and an emitter terminal (E). The collector terminal of transistor Q6 forms the BIAS input while the emitter terminal of transistor Q6 is coupled to VCC via transistor Q8 which is connected in a diode configuration. The base terminal of transistor Q6 is coupled to the base terminal of transistor Q7 at node 402. Transistor Q5 is connected in a base current compensation arrangement so that its emitter terminal is coupled to the base terminal of transistor Q6 at node 402, its collector terminal is coupled to ground and its base terminal is coupled to the collector terminal of transistor Q6 at node 406. With transistor Q5 connected in this manner, a voltage at the base terminal of transistor Q6 is prevented from rising more than the base-emitter voltage drop above the voltage presented to the BIAS input.

To insure proper matching, transistor Q7 is preferably substantially matched to transistor Q6. With the base voltage at node 402 of the two transistors Q6, Q7 being the same (i.e., $V_B = V_{BIAS} + V_{EB,Q5}$), it can be easily shown that the base-emitter voltage of transistor Q8 ($V_{BE,Q8}$) will appear across resistor R2. Thus, the bias current $I_1$ will be substantially equal to $V_{BE,Q8}/R2$. The temperature coefficient of a typical base-emitter junction is approximately −2 mV/degree Celsius, while the temperature coefficient of a typical diffused resistor, for example, is on the order of a few thousand (e.g., 2000–4000) parts per million (ppm) per degree Celsius with a positive slope.

In a hard disk drive preamplifier application, the exponential transconductance amplifier of the present invention may be used in conjunction with a conventional linear transconductance amplifier, as previously stated, for providing a fast response time to widely varying load conditions. An example of such varying load conditions may include, for example, transitions from a read mode to a write mode, or vice versa, while reading data from or writing data to a storage medium, as previously described.

Although illustrative embodiments of the present invention have been described herein with reference to the accompanying drawings, it is to be understood that the invention is not limited to those precise embodiments, and that various other changes and modifications may be made therein by one skilled in the art without departing from the scope or spirit of the invention.

What is claimed is:

1. A non-linear transconductance amplifier, comprising:
   a differential input stage, the differential input stage including first and second inputs forming a non-inverting input and an inverting input, respectively, of the amplifier for receiving an input differential signal; and
   a non-linear transconductance stage operatively coupled to the differential input stage, the non-linear transconductance stage generating an output of the amplifier having a linear transconductance when the input differential signal is within a predetermined range and a non-linear transconductance when the input differential signal is outside the predetermined range, the non-linear transconductance stage including a threshold circuit for operatively controlling a threshold region of the amplifier wherein the output of the amplifier exhibits a linear transconductance;
   wherein the non-linear transconductance stage comprises first and second load transistors, the threshold circuit being operatively coupled between the load transistors.

2. The amplifier of claim 1, wherein the non-linear transconductance stage is an exponential transconductance stage.

3. The amplifier of claim 1, wherein the threshold circuit includes a single resistance element and the threshold region of the amplifier is selected by operatively adjusting a value of the resistance element.

4. The amplifier of claim 1, wherein the transconductance of the output of the amplifier is substantially zero when the input differential signal is within the predetermined range.

5. The amplifier of claim 1, wherein the differential input stage comprises:
   first and second input transistors, the first and second input transistors being operatively coupled in a differential pair configuration; and
   a bias circuit operatively coupled to the input transistors, the bias circuit supplying a quiescent current for biasing the input transistors to a predetermined operating point.

6. A non-linear transconductance amplifier, comprising:
   a differential input stage, the differential input stage including first and second inputs forming a non-inverting input and an inverting input, respectively, of the amplifier for receiving an input differential signal; and
   a non-linear transconductance stage operatively coupled to the differential input stage, the non-linear transconductance stage generating an output of the amplifier having a linear transconductance when the input differential signal is within a predetermined range and a non-linear transconductance when the input differential signal is outside the predetermined range, the non-linear transconductance stage including a threshold circuit for operatively controlling a threshold region of the amplifier wherein the output of the amplifier exhibits a linear transconductance;
   wherein the non-linear transconductance stage comprises:
      first and second load transistors, the load transistors being operatively connected to the differential input stage in a cross-coupled arrangement and the threshold circuit being operatively coupled between the load transistors;

first and second non-linear transconductance transistors operatively coupled to the first and second load transistors, respectively, the first and second non-linear transconductance transistors forming first and second outputs, respectively, of the amplifier; and a bias circuit operatively connected to the non-linear transconductance transistors for biasing the non-linear transconductance stage to a predetermined quiescent operating point.

7. The amplifier of claim 6, wherein the non-linear transconductance stage further comprises:

first and second voltage level shifters, the first voltage level shifter being operatively coupled between the first load transistor and the differential input stage, the second voltage level shifter being operatively coupled between the second load transistor and the differential input stage.

8. The amplifier of claim 6, wherein the first and second non-linear transconductance transistors are bipolar junction transistors.

9. The amplifier of claim 6, wherein the bias circuit comprises:

first and second transistors, the first transistor being connected in a diode arrangement and being coupled to the second transistor in a current mirror configuration, the first transistor being operatively coupled to the first non-linear transconductance transistor, the second transistor being operatively coupled to the second non-linear transconductance transistor, the output of the amplifier being formed at a junction of the second bias transistor and the second non-linear transconductance transistor.

10. The amplifier of claim 1, wherein the non-linear transconductance stage comprises:

first, second, third and fourth metal-oxide-semiconductor (MOS) transistors, each of the MOS transistors including a drain terminal, a gate terminal and a source terminal, the gate and drain terminals of the first and fourth MOS transistors being operatively coupled to the differential input stage, the drain terminal of the third MOS transistor being connected to the source terminal of the first MOS transistor, the drain terminal of the second MOS transistor being connected to the source terminal of the fourth MOS transistor, the gate terminals of the first and second MOS transistors being coupled together, the gate terminals of the third and fourth MOS transistors being coupled together, and the source terminals of the second and third MOS transistors being connected to a negative voltage supply;

first and second bipolar junction transistors, each of the bipolar transistors including an emitter terminal, a base terminal and a collector terminal, the emitter terminals of the bipolar transistors being connected to the negative voltage supply, the base terminal of the first bipolar transistor being coupled to the drain terminal of the third MOS transistor, and the base terminal of the second bipolar transistor being coupled to the drain terminal of the second MOS transistor;

a bias circuit operatively coupled to the collector terminals of the bipolar transistors, the bias circuit biasing the bipolar transistors to a predetermined quiescent operating point; and a resistor connected between the base terminals of the bipolar transistors, the threshold region of the amplifier being selected by operatively adjusting a value of the resistor.

11. The amplifier of claim 10, wherein the bias circuit comprises:

first and second MOS transistors operatively coupled to the collector terminals of the bipolar transistors in a current mirror configuration.

12. The amplifier of claim 11, wherein the bias circuit further comprises:

third and fourth MOS transistors coupled between the first and second MOS transistors, respectively, and the collector terminals of the bipolar transistors in a cascode configuration.

13. The amplifier of claim 1, further comprising:

a temperature compensation circuit operatively coupled to at least the differential input stage, the temperature compensation circuit being configured to generate a threshold region that is substantially constant over a predetermined temperature range.

14. The amplifier of claim 13, wherein:

the temperature compensation circuit includes a bias current generator having at least one base-emitter junction, the bias current generator producing a bias current for the differential input stage that is proportional to a base-emitter voltage of the junction.

15. An integrated circuit including at least one amplifier, the at least one amplifier comprising:

a differential input stage, the differential input stage including first and second inputs forming a non-inverting input and an inverting input, respectively, of the amplifier for receiving an input differential signal; and a non-linear transconductance stage operatively coupled to the differential input stage, the non-linear transconductance stage generating an output of the amplifier having a linear transconductance that is substantially zero when the input differential signal is within a predetermined range and a non-linear transconductance when the input differential signal is outside the predetermined range, the non-linear transconductance stage including a threshold circuit for operatively controlling a threshold region of the amplifier wherein the output of the amplifier exhibits a linear transconductance;

wherein the non-linear transconductance stage comprises first and second load transistors, the threshold circuit being operatively coupled between the load transistors.

16. The integrated circuit of claim 15, wherein the threshold circuit in each of the amplifiers includes a single resistive element and the threshold region of the amplifier is selected by operatively adjusting a value of the resistive element.

17. An integrated circuit including at least one amplifier, the at least one amplifier comprising:

a differential input stage, the differential input stage including first and second inputs forming a non-inverting input and an inverting input, respectively, of the amplifier for receiving an input differential signal; and a non-linear transconductance stage operatively coupled to the differential input stage, the non-linear transconductance stage generating an output of the amplifier having a linear transconductance that is substantially zero when the input differential signal is within a predetermined range and a non-linear transconductance when the input differential signal is outside the predetermined range, the non-linear transconductance stage including a threshold circuit for operatively controlling a threshold region of the amplifier wherein the output of the amplifier exhibits a linear transconductance;

wherein the non-linear transconductance stage in each of the amplifiers comprises:
  first and second load transistors, the load transistors being operatively connected to the differential input stage in across-coupled arrangement and the threshold circuit being operatively coupled between the load transistors;
  first and second non-linear transconductance transistors operatively coupled to the first and second load transistors, respectively, the first and second non-linear transconductance transistors forming first and second outputs, respectively, of the amplifier; and
  a bias circuit operatively connected to the non-linear transconductance transistors for biasing the non-linear transconductance stage to a predetermined quiescent operating point.

18. The integrated circuit of claim 15, wherein the non-linear transconductance stage in each of the amplifiers further comprises:
  first and second voltage level shifters, the first voltage level shifter being operatively coupled between the first load transistor and the differential input stage, the second voltage level shifter being operatively coupled between the second load transistor and the differential input stage.

19. The integrated circuit of claim 18, wherein the first and second non-linear transconductance transistors are bipolar junction transistors.

20. The integrated circuit of claim 15, wherein the non-linear transconductance stage in each of the amplifiers comprises:
  first, second, third and fourth metal-oxide-semiconductor (MOS) transistors, each of the MOS transistors including a drain terminal, a gate terminal and a source terminal, the gate and drain terminals of the first and fourth MOS transistors being operatively coupled to the differential input stage, the drain terminal of the third MOS transistor being connected to the source terminal of the first MOS transistor, the drain terminal of the second MOS transistor being connected to the source terminal of the fourth MOS transistor, the gate terminals of the first and second MOS transistors being coupled together, the gate terminals of the third and fourth MOS transistors being coupled together, and the source terminals of the second and third MOS transistors being connected to a negative voltage supply;
  first and second bipolar junction transistors, each of the bipolar transistors including an emitter terminal, a base terminal and a collector terminal, the emitter terminals of the bipolar transistors being connected to the negative voltage supply, the base terminal of the first bipolar transistor being coupled to the drain terminal of the third MOS transistor, and the base terminal of the second bipolar transistor being coupled to the drain terminal of the second MOS transistor;
  a bias circuit operatively coupled to the collector terminals of the bipolar transistors, the bias circuit biasing the bipolar transistors to a predetermined quiescent operating point; and
  a resistor connected between the base terminals of the bipolar transistors, the threshold region of the amplifier being selected by operatively adjusting a value of the resistor.

21. The integrated circuit of claim 15, each of the amplifiers further comprising:
  a temperature compensation circuit operatively coupled to at least the differential input stage, the temperature compensation circuit being configured to generate a threshold region that is substantially constant over a predetermined temperature range.

22. The integrated circuit of claim 21, wherein:
  the temperature compensation circuit includes a bias current generator having at least one base-emitter junction, the bias current generator producing a bias current for the differential input stage that is proportional to a base-emitter voltage of the junction.

23. A non-linear transconductance amplifier, comprising:
  a differential input stage, the differential input stage including first and second inputs forming a non-inverting input and an inverting input, respectively, of the amplifier for receiving an input differential signal; and
  a non-linear transconductance stage operatively coupled to the differential input stage, the non-linear transconductance stage generating an output of the amplifier having a linear transconductance when the input differential signal is within a predetermined range and a non-linear transconductance when the input differential signal is outside the predetermined range, wherein said non-linear transconductance stage may be adjusted to control a threshold region wherein the output of the amplifier exhibits a linear transconductance;
  wherein the non-linear transconductance stage includes a threshold circuit having a single resistance element and the threshold region of the amplifier is selected by operatively adjusting a value of the resistance element.

24. The amplifier of claim 23, wherein the non-linear transconductance stage is an exponential transconductance stage and the amplifier generates a substantially pure exponential output when the input differential signal is outside the predetermined range.

* * * * *